US011373837B2

(12) United States Patent
Liao et al.

(10) Patent No.: US 11,373,837 B2
(45) Date of Patent: Jun. 28, 2022

(54) METAL ION SOURCE EMITTING DEVICE

(71) Applicants: Beijing Normal University, Beijing (CN); Guangdong Guangxin Ion Beam Technology Co., Ltd., Guangzhou (CN)

(72) Inventors: Bin Liao, Beijing (CN); Xiao Ouyang, Beijing (CN); Guoliang Wang, Beijing (CN); Xiaoping Ouyang, Beijing (CN); Jun Luo, Beijing (CN); Pan Pang, Beijing (CN); Lin Chen, Beijing (CN); Xu Zhang, Beijing (CN); Xianying Wu, Beijing (CN); Minju Ying, Beijing (CN)

(73) Assignees: Beijing Normal University, Beijing (CN); GUANGXIN ION BEAM TECHNOLOGY CO., LTD., Guangdong (CN)

( * ) Notice: Subject to any disclaimer, the term of this patent is extended or adjusted under 35 U.S.C. 154(b) by 115 days.

(21) Appl. No.: 16/928,529

(22) Filed: Jul. 14, 2020

(65) Prior Publication Data
US 2021/0343495 A1 Nov. 4, 2021

(30) Foreign Application Priority Data
Apr. 30, 2020 (CN) .......................... 202010363614.1

(51) Int. Cl.
*H01J 37/08* (2006.01)
*H01J 37/075* (2006.01)
*H01J 37/32* (2006.01)

(52) U.S. Cl.
CPC ............ *H01J 37/08* (2013.01); *H01J 37/075* (2013.01); *H01J 37/32559* (2013.01); *H01J 37/32614* (2013.01)

(58) Field of Classification Search
CPC ........ H01J 27/024; H01J 27/08; H01J 27/022; H01J 37/08; H01J 37/075; H01J 37/32559; H01J 37/32614
See application file for complete search history.

(56) References Cited

U.S. PATENT DOCUMENTS 5,763,890 A * 6/1998 Cloutier .................. H01J 27/08
250/492.21
6,137,231 A * 10/2000 Anders ............... H01J 37/3244
315/111.41

(Continued)

FOREIGN PATENT DOCUMENTS

| CN | 107248490 A | 10/2017 |
| CN | 109082635 A | 12/2018 |

OTHER PUBLICATIONS

Xiangzheng, Zhu et al., "A Multi-Cathode Metal Vapor Vacuum Arc Ion Source," Nuclear Techniques vol. 14. No. 8 (1991) pp. 479-481.

*Primary Examiner* — David E Smith
(74) *Attorney, Agent, or Firm* — Thomas | Horstemeyer, LLP

(57) ABSTRACT

The disclosure provides a metal ion source emitting device comprising a ceramic chamber, a leading-out electrode chamber and three cathodes hermetically connected, a trigger electrode fixed on a ceramic insulating element, a cathode target material fixed on an indirect cooling channel, a limiting element fixed on a fixed element, the fixed element fixing the indirect cooling channel on a cathode cooling pipe, the cathode cooling pipe fixed on a cathode flange, a trigger binding post connected with the trigger electrode, a leading-out electrode and an accelerating electrode arranged right below a cathode in the leading-out electrode chamber, and leading-out slits formed on the accelerating electrode and the leading-out electrode. According to the emitting device, three cathodes can operate (Continued)

simultaneously with only one anode, increasing irradiation area of an ion source, and improving the operating efficiency and energy utilization rate, with a more compact emitting source and larger processing area.

10 Claims, 3 Drawing Sheets

(56) References Cited

U.S. PATENT DOCUMENTS

| | | | | |
|---|---|---|---|---|
| 2003/0218429 A1* | 11/2003 | Kinoyama | .............. | H01J 27/04 |
| | | | | 315/111.41 |
| 2014/0145581 A1* | 5/2014 | Jerez | ................... | H01J 37/3171 |
| | | | | 313/231.41 |

* cited by examiner

METAL ION SOURCE EMITTING DEVICE

CROSS REFERENCE TO RELATED APPLICATION

This application claims the priority of Chinese Patent Application No. 202010363614.1, entitled "Metal Ion Source Emitting Device" filed with the Chinese Patent Office on Apr. 30, 2020, which is incorporated herein by reference in its entirety.

TECHNICAL FIELD

The disclosure relates to the technical field of ion emitting sources, in particular to a metal ion source emitting device.

BACKGROUND ART

The existing emitting source has a poor operating stability. Only one emitting source is used under a condition of one accelerating voltage, which leads to a low utilization rate of energy, and the products are damaged and burnt due to a high energy of the emitting ion source. Meanwhile, there exists a low processing efficiency with a small beam diameter of a single emitting source.

SUMMARY

The disclosure aims to provide a metal ion source emitting device which solves the problems of high energy consumption, poor continuous operating stability, low beam current and efficiency, small beam current diameter and the like of the existing metal ion source emitting device. According to the disclosure, a lead coating operation is carried out on the cathode emitting terminal, to ensure that the resistance between each component can be stabilized to a certain range.

In order to achieve the above object, the disclosure provides the following solution: a metal ion source emitting device comprises a ceramic chamber, a leading-out electrode chamber and three cathodes arranged side by side hermetically connected, wherein the three cathodes have a same structure, and the cathode extending into the ceramic chamber comprises a cathode target material, a trigger electrode, a ceramic insulating element, a limiting element, a fixed element, a cathode cooling pipe, a cathode flange and a trigger binding post, the trigger electrode being fixed on the ceramic insulating element, the cathode target material being fixed on an indirect cooling channel, the limiting element being fixed on the fixed element, the fixed element fixing the indirect cooling channel on the cathode cooling pipe through a screw fastener, the cathode cooling pipe being fixed on the cathode flange, and the trigger binding post being connected with the trigger electrode through a wire;

Wherein, a leading-out electrode and an accelerating electrode are arranged right below the cathode in the leading-out electrode chamber, and leading-out slits are arranged on the accelerating electrode and the leading-out electrode.

Optionally, the trigger electrode is fixed on the ceramic insulating element through a screw, an insulating sleeve is fixed on the ceramic insulating element through a rotating screw fastener, and the insulating sleeve adopts a boron nitride insulating sleeve.

Optionally, the cathode target material is fixed on the indirect cooling copper sleeve through a screw fastener.

Optionally, the cathode cooling pipe is fixed on the cathode flange through a screw, and the cathode flange and the cathode cooling pipe are sealed through an O-shaped sealing ring.

Optionally, the cathode further comprises a cooling copper pipe fixed on the cathode cooling pipe through a screw fastener.

Optionally, the cathode flange is fixedly provided with a male and female screw fastener composed of a trigger insulating sleeve and a fixed insulating sleeve, and the trigger binding post is fixed on the fixed insulating sleeve through a nut.

Optionally, a resistance of 1-2 megohms and a trigger voltage of 6-10 kV exists between the cathode and an anode.

Optionally, the accelerating electrode and the leading-out electrode arranged right below the cathode have completely consistent sizes and positions of the leading-out slits with each other.

Optionally, a plurality of insulating struts are uniformly provided along a circumferential direction of the cathode flange, a bottom of the insulating strut is fixed with a top of the leading-out electrode chamber, and the ceramic chamber arranged between the cathode flange and the leading-out electrode chamber is surrounded by the insulating struts.

Optionally, the leading-out slit is circular hole-shaped or rectangular.

Compared with the prior art, the disclosure achieves the following technical effects:

According to the metal ion source emitting device of the present disclosure, three cathodes can operate simultaneously with only one anode, which increases an irradiation area of an ion source, and improves the operating efficiency and the energy utilization rate. According to the ion source emitting device of the present disclosure, the emitting source is more compact; the emitting source is more energy-saving and environment-friendly since a set of acceleration voltages can realize accelerations of a plurality of emitting sources; a processing area is larger so that a sample with a diameter up to 1000 mm can be processed; and a shape of the led-up beam spot can be controlled according to requirements, such as a stripe-shape or a circular shape.

BRIEF DESCRIPTION OF THE DRAWINGS

In order to more clearly illustrate the embodiments of the present disclosure or the technical solutions in prior art, the drawings that need to be used in the embodiments are briefly described below. It is obvious that the drawings in the following description are only some embodiments of the disclosure, and that those skilled in the art can obtain other drawings from these drawings without involving any inventive effort.

1 cathode; 2 cathode flange; 201 trigger electrode; 202 insulating sleeve; 203 ceramic insulating element; 204 cathode target material; 205 limiting element; 206 fixed element; 207 indirect cooling copper sleeve; 209 cooling copper pipe; 210 cathode cooling pipe; 211 trigger insulating sleeve; 212 fixed insulating sleeve; 213 trigger binding post; 301 leading-out electrode; 302 accelerating electrode; 303 leading-out slit; 4 ceramic chamber; 5 suppression electrode; 6 leading-out electrode chamber; 7 Insulating strut.

DETAILED DESCRIPTION OF THE EMBODIMENTS

The technical solutions of the embodiments of the present disclosure will now be described more clearly and fully hereinafter with reference to the accompanying drawings of the embodiments of the present disclosure. It is to be understood that the described embodiments are only a few, but not all, embodiments of the disclosure. On the basis of the embodiments of the present disclosure, all other embodiments obtained by a person of ordinary skill in the art without involving any inventive effort are within the scope of the present disclosure.

The disclosure aims to provide a metal ion source emitting device which solves the problems of high energy consumption, poor continuous operating stability, low beam current and efficiency, small beam current diameter and the like of the existing metal ion source emitting device. According to the disclosure, a lead coating operation is carried out on an cathode emitting terminal, so that a resistance between each component can be stabilized to a certain range.

To further clarify the objects, features and advantages of the present disclosure, a more particular description of the disclosure will be rendered by reference to the accompanying drawings and specific embodiments thereof.

Figure 1:
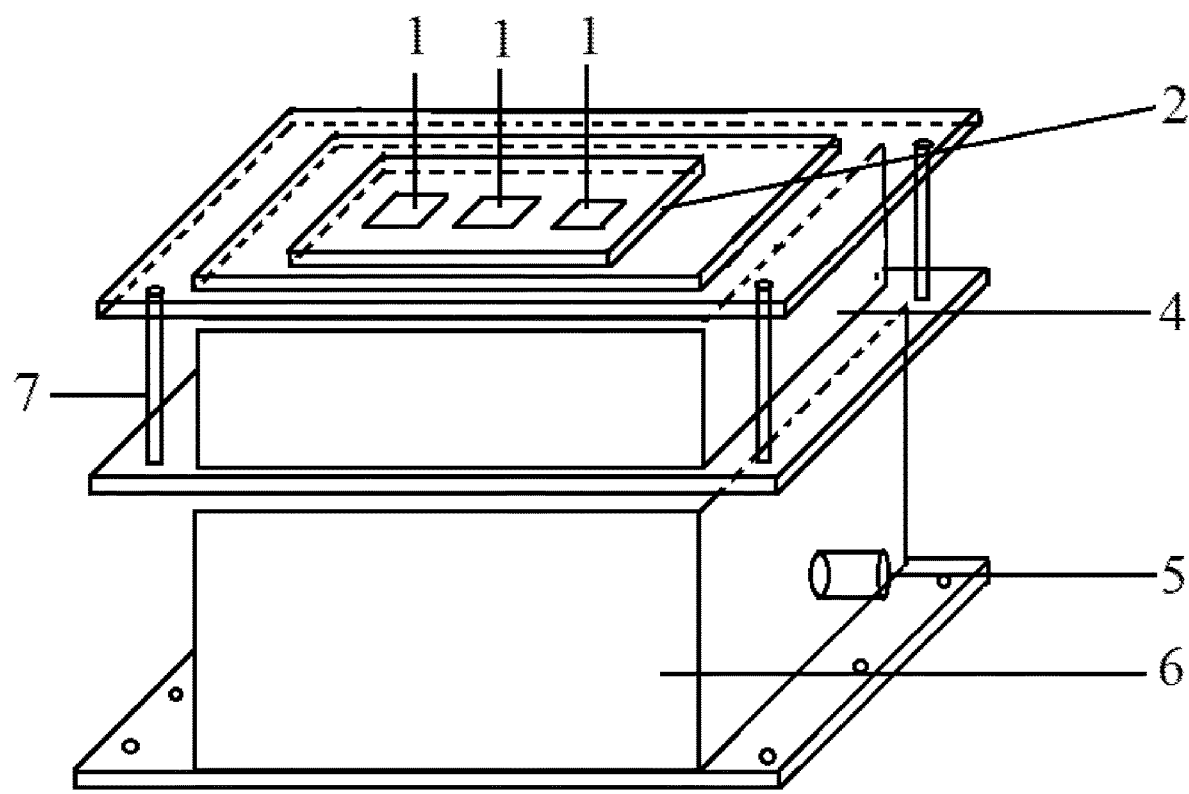
FIG. 1 is a schematic view showing an overall structure of an ion source emitting device.
Figure 2:
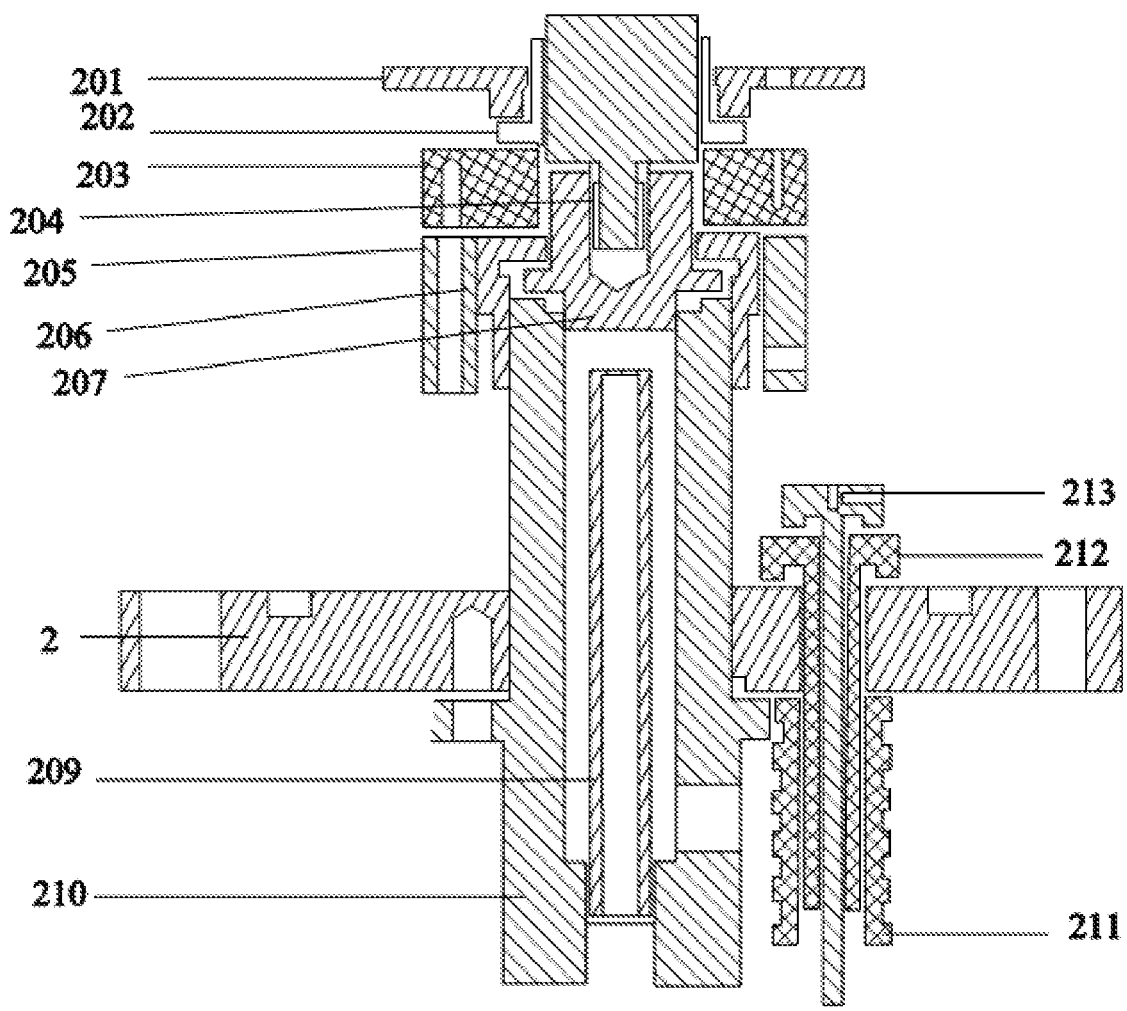
FIG. 2 is a schematic view showing a composition of a cathode.
Figure 3:
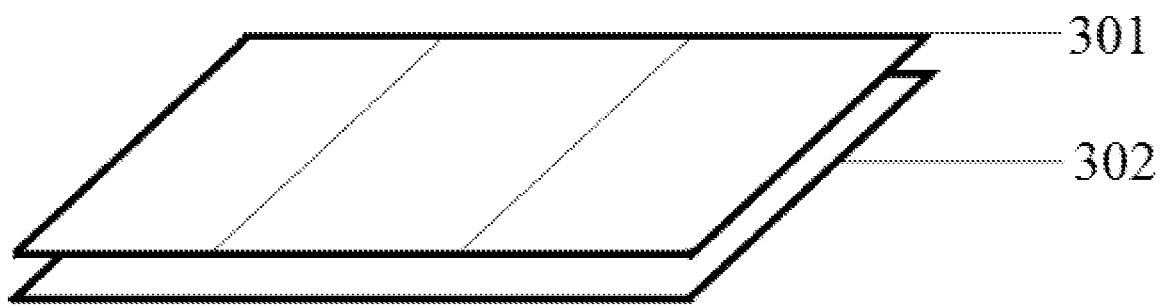
FIG. 3 is a schematic view showing a leading-out electrode and an accelerating electrode.
Figure 4:
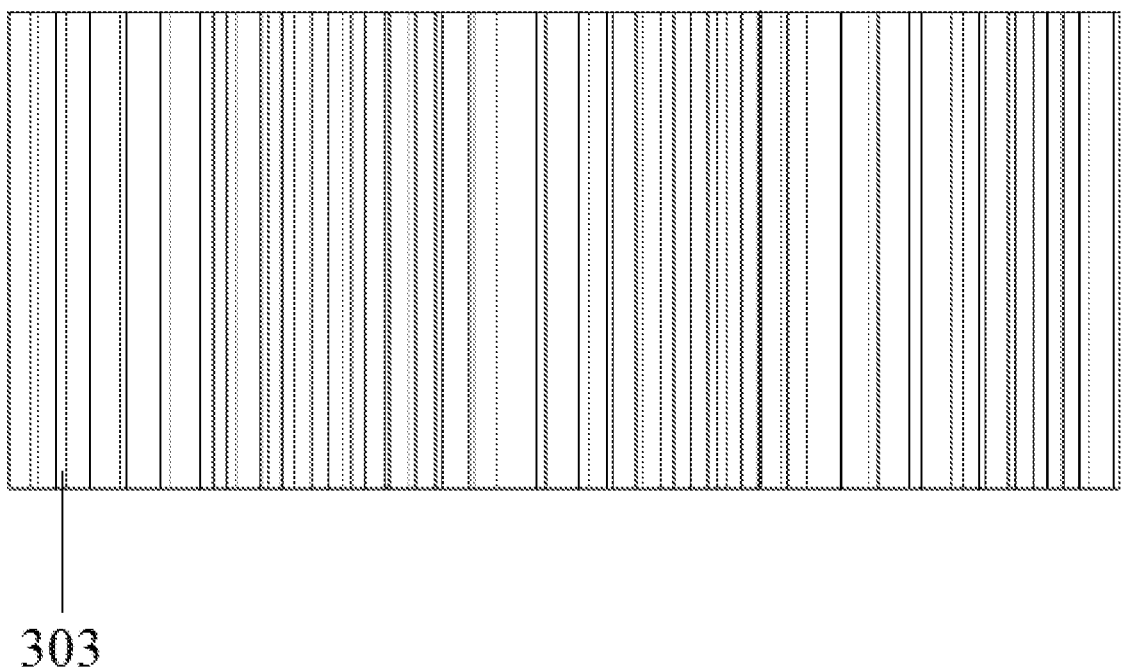
FIG. 4 is a schematic view showing a leading-out slit.

As shown in FIGS. 1-4, the disclosure provides a metal ion source emitting device which comprises three cathodes 1 arranged side by side, a ceramic chamber 4 and a leading-out electrode chamber 6 hermetically connected, wherein the cathode 1 includes a cathode target material 204, a trigger electrode 201, a ceramic insulating element 203, a limiting element 205, a fixed element 206, a cathode cooling pipe 210, a cathode flange 2, and a trigger binding post 213. Wherein, the trigger electrode 201 is fixed on the ceramic insulating element 203 through a screw, the insulating sleeve 202 is fixed on the ceramic insulating element 203 through a rotating screw fastener, the cathode target material 204 is fixed on the indirect cooling copper sleeve 207 through a screw fastener, the limiting element 205 is fixed on the fixed element 206 through a screw, the fixed element 206 fixes the indirect cooling copper sleeve 207 on the cathode cooling pipe 210 through a screw fastener, the cathode cooling pipe 210 is fixed on the cathode flange 208 through a screw, the cathode flange 208 and the cathode cooling pipe 210 are sealed through an O-shaped sealing ring, the cooling copper pipe 209 is fixed on the cathode cooling pipe 210 through a screw fastener, the trigger insulating sleeve 211 and the fixed insulating sleeve 212 as male and female screw fasteners are fixed on the cathode flange 208, and the trigger binding post 213 is fixed on the fixed insulating sleeve 212 through a nut.

A suppression electrode 5 is arranged in the leading-out electrode chamber 6 on the ground. A leading-out electrode 301 of the leading-out electrode chamber 6 is provided with leading-out slits 303. A plurality of insulating struts 7 are uniformly arranged along the circumferential direction of the cathode flange 2, and bottoms of the insulating struts 7 are fixed to a top of the leading-out electrode chamber 6.

Further, a resistance of 1-2 megohms and a trigger voltage of 6-10 kV exists between the cathode 1 and a trigger anode. Plasma is generated during ignition formed between the cathode and the anode after being triggered, so as to form ion beam emission.

The operating principle of the cathode 1 in the disclosure lies in that: the cathode target material 204 and the trigger electrode 201 form arc discharge through high-voltage breakdown to form pulse plasma on a surface of the cathode target material 204, and then the pulse plasma is led out through a leading-out system in the following figures; the trigger binding post 213 is connected with the trigger electrode 201 through a wire to input high voltage for breakdown; and the cooling copper pipe 209 is supplied with cooling water to cool the cathode.

In particular, the relevant parameters of the components in the cathode are as follows:

The trigger voltage of the trigger electrode 201 is 5-7 KV, and the trigger frequency thereof is 0-100 Hz. The insulating sleeve 202 is a boron nitride insulating sleeve with a insulating resistance larger than 1015 ohms, and a diameter not larger than that of the cathode target material 204 by 0.1 mm. The insulating resistance of the insulating sleeve of the ceramic insulating element 203 is larger than 1015 ohms per se and can be processed. The cathode target material 204 itself has a resistance less than 1 megaohm, a machinable diameter of 10-30 mm, and a service life longer than 30 h. The limiting element 205 is made of a machinable metal material. The fixed element 206 is made of a machinable metal material. The indirect cooling copper sleeve 207 is made of a machinable metal material. The cathode flange 2 is made of also a machinable metal material. The cooling copper pipe 209 is made of a machinable metal material and has a maximum diameter of 10-25 mm. The cathode cooling pipe 210 is a copper pipe with a diameter of 1-15 mm, and a length of 40-60 mm. The trigger insulating sleeve 211 is made of a machinable polymer material with a withstand voltage of 1-20 kV. The fixed insulating sleeve 212 is made of a machinable polymer material with a withstand voltage of 1-20 kV. The trigger binding post 213 is made of a machinable metal material with a maximum diameter of 1-15 mm. Above relevant parameters can be appropriately adjusted and changed according to a practical application, which all fall within the scope of the present disclosure.

The operating process of the metal ion source emitting device is as follows:

The trigger electrode is input with a high voltage and forms a potential difference with the cathode 1. When the input high voltage reaches a certain value (>3 KV), a short circuit occurs between the trigger electrode and the cathode 1, so that arc discharge is formed to eject plasma. The plasma is accelerated through an accelerating electrode 302 in the ceramic chamber 4. Herein, the accelerating voltage is applied to the accelerating electrode 302, and the suppression electrode 5 is arranged in the leading-out ionization chamber. Since electrons are easily generated when high-energy metal bombards stainless steel, the voltage of the suppression electrode 5 is 0-800 V in order to eliminate the interference of electron beams, which can effectively suppress the generation and leading-out of the electrons, so that what is led out are all ion beams.

The shape of the leading-out slit 303 on the leading-out electrode 301 determines a shape of the led out beam. If the leading-out slit 303 is circular, the led out beam is a circular beam spot. If the leading-out slit 303 is a rectangular strip, the led out beam spot is a rectangle, and a direction of the rectangular strip is perpendicular to a direction of a strip of the leading-out slit. The leading-out electrode 301 leads out plasma formed by arc discharge, and the accelerating electrode 302 accelerates positive ions in the plasma by setting a high negative voltage. The leading-out electrode 301 and the accelerating electrode 302 are arranged right below the cathode 1 and have completely consistent sizes and slit positions with each other, wherein the positions of he leading-out slits are also arranged right below the cathode 1. The plasma is not lost in the place of the slit, but lost in the place of non-slit. The plasma is accelerated by the electric field of the accelerating electrode after entering the slit, and led out to a vacuum chamber through the accelerating slit for ion implantation.

In the embodiment, the leading-out electrode 301 has a specification of 200-500 mm long and 100-300 mm wide. The accelerating electrode 302 has a specification of 200-500 mm long and 100-300 mm wide. The leading-out slits 303 have a specification of 100-300 mm long, 1-5 mm wide, and 80-400 strips. The accelerating electrode 302 and the leading-out electrode 301 have consistent leading-out slits, and a spacing of 3-10 mm.

Three sets of pulse ion sources operate simultaneously and share one set of accelerating electrode 302 and leading-out electrode 301 with a normal operating voltage of 10-20 kV, a led out beam of 1-100 mA, and a maximum diameter of the led out beam of 1000-1200 mm.

The three sets of ion sources do not interfere with each other during operation. The trigger binding post 213 is a magnetic conduction component, which can form a natural shielding body during operation of the three sets of pulse ion sources to avoid generating a crosstalk of plasmas generated during operation of the ion sources, to cause a leading-out beam current greatly reduced, and an position of the trigger point irregularly affect the service life of the cathode target material 204.

The cathode flange 2 is mainly used for mounting the target material of the cathode 1, a trigger electrode (anode) and a related cooling device. The leading-out electrode chamber 6 is at ground potential, and the insulating strut 7 and a magnetic ring are mainly used for insulating the ground and the high-voltage accelerating electrode 3. The suppression electrode 5 mainly suppresses and prevents generation and leading-out of electrons. The cathode flange 2, the magnetic cylinder, the accelerating electrode 302 and the leading-out electrode chamber 6 are all sealed through O-ring connections.

The ion source emitting device of the disclosure is a novel ion source leading-out-accelerating electrode structure, wherein a leading-out electrode is designed from a circular hole type leading-out into a strip-shaped leading-out shape with equal width, and a distance between the accelerating electrodes 302 is not constant any more, and is designed with a continuously changed leading-out spacing, namely the distance between the accelerating electrodes 302 changes from 5 mm into a variable interval of 3-7 mm. By implementing the disclosure, a shape of the ion beam spot is obviously changed, wherein the original circular beam spot is changed into an elongated beam spot with a size of (100-200 mm)×(300-800 mm), which greatly increases a longitudinal width of the ion beam spot, and has an obvious advantage during a process of an elongated workpiece. Meanwhile, the ion beam current is greatly increased by changing the leading-out-accelerating electrode 302, and the service life of the target material of the cathode 1 can be greatly increased at the same beam intensity. The cathode 1 of the whole device is expanded into three assemblies side by side, the anode is still one, and a shape of the corresponding leading-out electrode chamber 6 is converted into a rectangle so as to place the three assemblies of the cathode 1, such that three cathodes 1 can operate simultaneously under the condition of one anode, which increases the irradiation area of the ion source, and improves the operating efficiency and the energy utilization rate.

The principles and implementations of the present disclosure have been described with specific examples, and the illustrations of the embodiments are presented to aid in the understanding of the methods and core concepts of the present disclosure. At the same time, those skilled in the art can change both the detailed implementations and the application scope in light of the teachings of this disclosure. In summary, the content of the description should not be construed as limiting the disclosure.

What is claimed is:

1. A metal ion source emitting device, comprising:
 a ceramic chamber, a leading-out electrode chamber and three cathodes arranged side by side hermetically connected, wherein the three cathodes have a same structure, and each cathode of the three cathodes extending into the ceramic chamber comprises a cathode target material, a trigger electrode, a ceramic insulating element, a limiting element, a fixed element, a cathode cooling pipe, a cathode flange and a trigger binding post, the trigger electrode being fixed on the ceramic insulating element, the cathode target material being fixed on an indirect cooling channel, the limiting element being fixed on the fixed element, the fixed element fixing the indirect cooling channel on the cathode cooling pipe through a screw fastener, the cathode cooling pipe being fixed on the cathode flange, and the trigger binding post being connected with the trigger electrode through a wire;
 wherein, a leading-out electrode and an accelerating electrode are arranged right below the cathodes in the leading-out electrode chamber, and leading-out slits are arranged on the accelerating electrode and the leading-out electrode.

2. The metal ion source emitting device according to claim 1, wherein, the trigger electrode is fixed on the ceramic insulating element through a screw, an insulating sleeve is fixed on the ceramic insulating element through a rotating screw fastener, and the insulating sleeve adopts a boron nitride insulating sleeve.

3. The metal ion source emitting device according to claim 1, wherein, the cathode target material is fixed on an indirect cooling copper sleeve through a screw fastener.

4. The metal ion source emitting device according to claim 1, wherein, the cathode cooling pipe is fixed on the cathode flange through a screw, and the cathode flange and the cathode cooling pipe are sealed through an O-shaped sealing ring.

5. The metal ion source emitting device according to claim 1, wherein, each cathode of the three cathodes further comprises a cooling copper pipe fixed on the cathode cooling pipe through a screw fastener.

6. The metal ion source emitting device according to claim 1, wherein, the cathode flange is fixedly provided with a male and female screw fastener composed of a trigger insulating sleeve and a fixed insulating sleeve, and the trigger binding post is fixed on the fixed insulating sleeve through a nut.

7. The metal ion source emitting device according to claim 1, wherein, a resistance of 1-2 megohms and a trigger voltage of 6-10 kV exists between each cathode of the three cathodes and an anode.

8. The metal ion source emitting device according to claim 1, wherein, the accelerating electrode and the leading-out electrode arranged right below the three cathodes have completely consistent sizes and positions of the leading-out slits with each other.

9. The metal ion source emitting device according to claim 1, wherein, a plurality of insulating struts are uniformly provided along a circumferential direction of the cathode flange, a bottom of the insulating strut is fixed with a top of the leading-out electrode chamber, and the ceramic chamber arranged between the cathode flange and the leading-out electrode chamber is surrounded by the insulating struts.

10. The metal ion source emitting device according to claim 1, wherein, the leading-out slit is circular hole-shaped or rectangular.

* * * * *